United States Patent [19]
Yoon et al.

[11] Patent Number: 6,160,382
[45] Date of Patent: Dec. 12, 2000

[54] METHOD AND APPARATUS FOR DETERMINING CHARACTERISTIC PARAMETERS OF A CHARGE STORAGE DEVICE

[75] Inventors: Chul Oh Yoon; Yevgen Barsukov, both of Taejeon; Jong Hyun Kim, Seoul, all of Rep. of Korea

[73] Assignee: Korea Kumbho Petrochemical Co., Ltd., Seoul, Rep. of Korea

[21] Appl. No.: 09/358,264

[22] Filed: Jul. 21, 1999

[30] Foreign Application Priority Data

Nov. 19, 1998 [KR] Rep. of Korea ...................... 98-49700

[51] Int. Cl.<sup>7</sup> .............................. H02J 7/00; G06F 17/00; G01R 25/00; G01N 27/416
[52] U.S. Cl. .................... 320/136; 320/134; 395/800.35; 702/65; 324/426
[58] Field of Search ...................................... 320/134, 136, 320/106; 395/500.35; 702/65; 324/426

[56] References Cited

U.S. PATENT DOCUMENTS

| | | | |
|---|---|---|---|
| 4,952,862 | 8/1990 | Biagetti et al. | 320/48 |
| 5,428,560 | 6/1995 | Leon et al. | 364/578 |
| 5,633,801 | 5/1997 | Bottman | 364/482 |
| 6,037,777 | 3/2000 | Champlin | 324/430 |

OTHER PUBLICATIONS

J. Ross Macdonald, et al., "Three Dimensional Perspective Plotting and Fitting of Immittance Data," Solid State Ionics, 5, (1981), 137–140.

G.S. Popkirov, et al., "A new impedance spectrometer for the investigation of electrochemical systems," Rev. Sci. Instrum. 63(11), (1992), 5366–5372.

Primary Examiner—Edward H. Tso
Assistant Examiner—Gregory J. Toatley, Jr.
Attorney, Agent, or Firm—Davidson, Davidson & Kappel, LLC

[57] ABSTRACT

A method and an apparatus for determining characteristic parameters of a charge storage device based on a wide frequency range of impedance measurement and a non-linear equivalent circuit model by which the parameters of the non-linear equivalent circuit model indicative of the characteristics of various charge storage devices such as a primary battery, secondary battery, capacitor, supercapacitor and fuel cell are determined, the method comprising the steps of: (1) measuring voltage and current characteristics in a process of charging/discharging of the charge storage device by applying a voltage/current at a predetermined discharge rate; (2) measuring impedance spectra at a predetermined range of frequency by measuring the current and voltage from both terminals of the charge storage device or from an electrical load directly connected to the charge storage device at a plurality of states of charge within the entire charge/discharge interval; and (3) obtaining the parameters of the non-linear equivalent circuit of the charge storage device from the charge or discharge characteristics measured in step (1) and the characteristic impedance spectrum in the predetermined range of frequency measured in step (2).

38 Claims, 11 Drawing Sheets

○ BATTERY IMPEDANCE SPECTRUM
■ FIT WITH STATIC MODEL

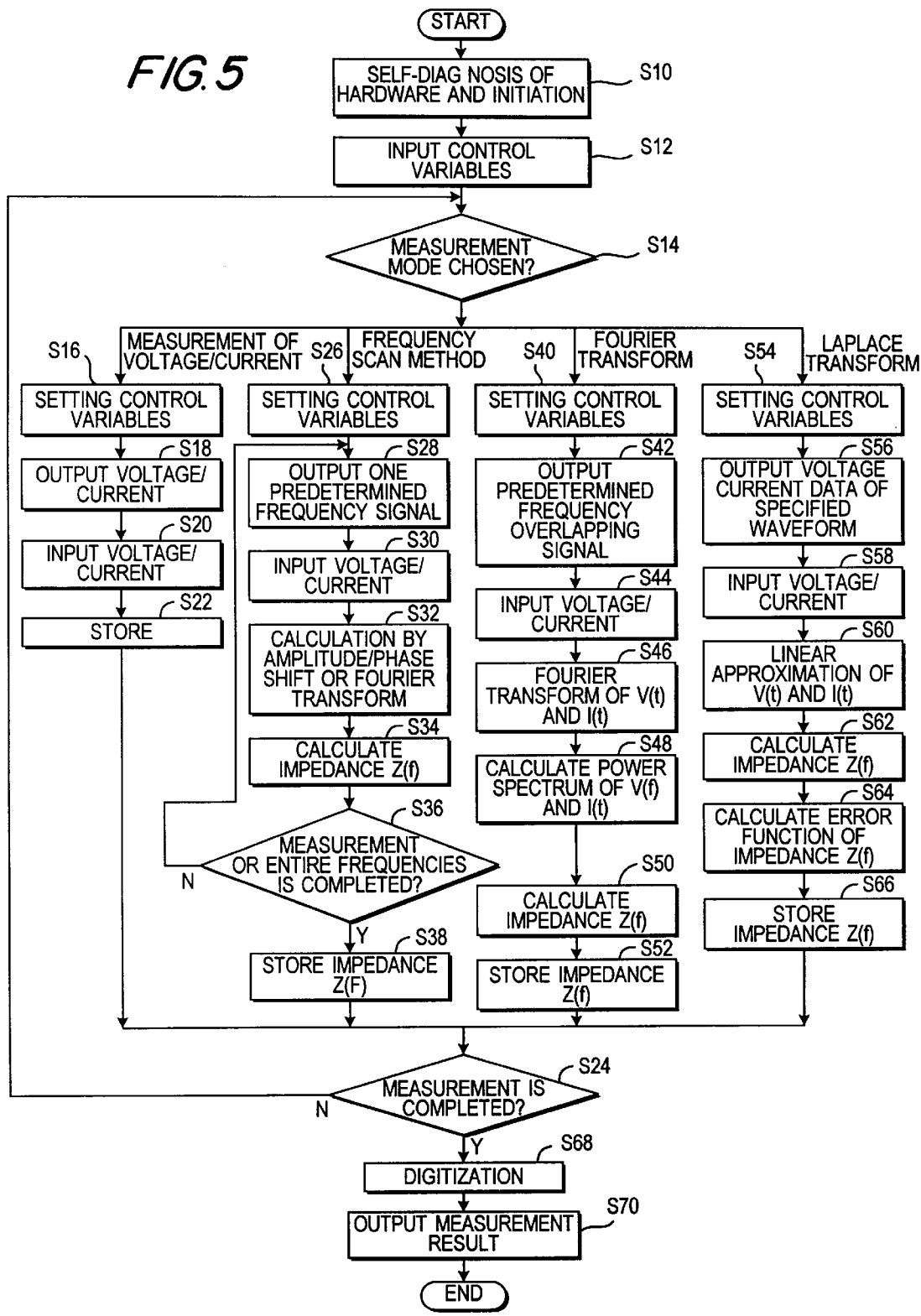

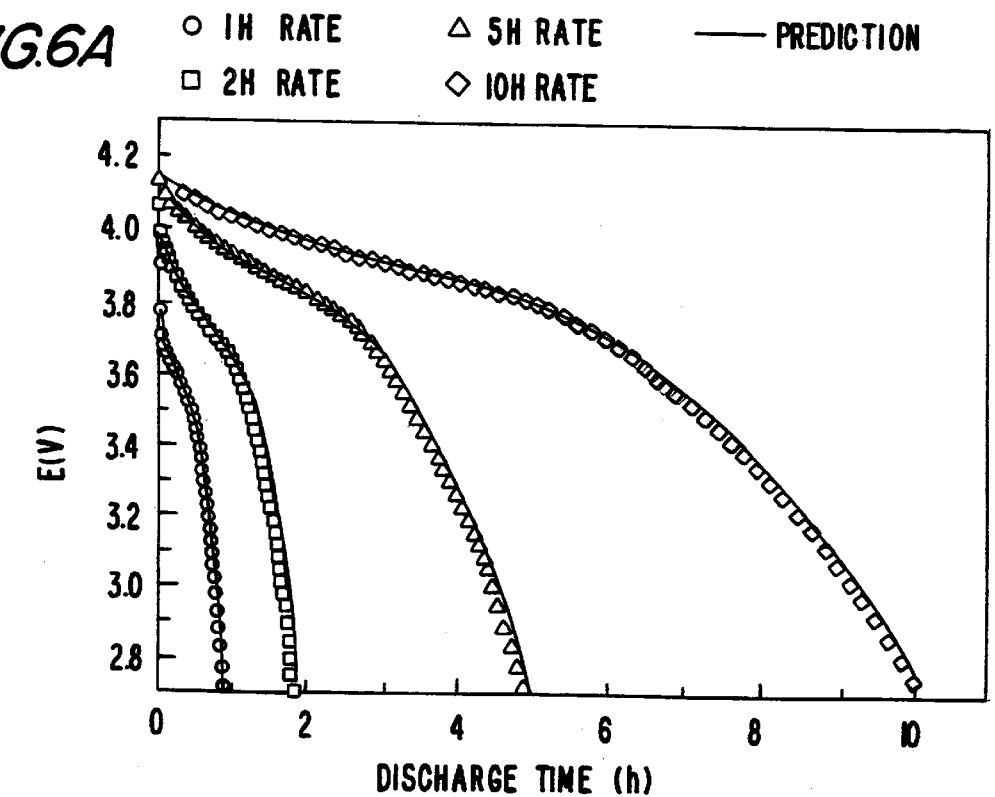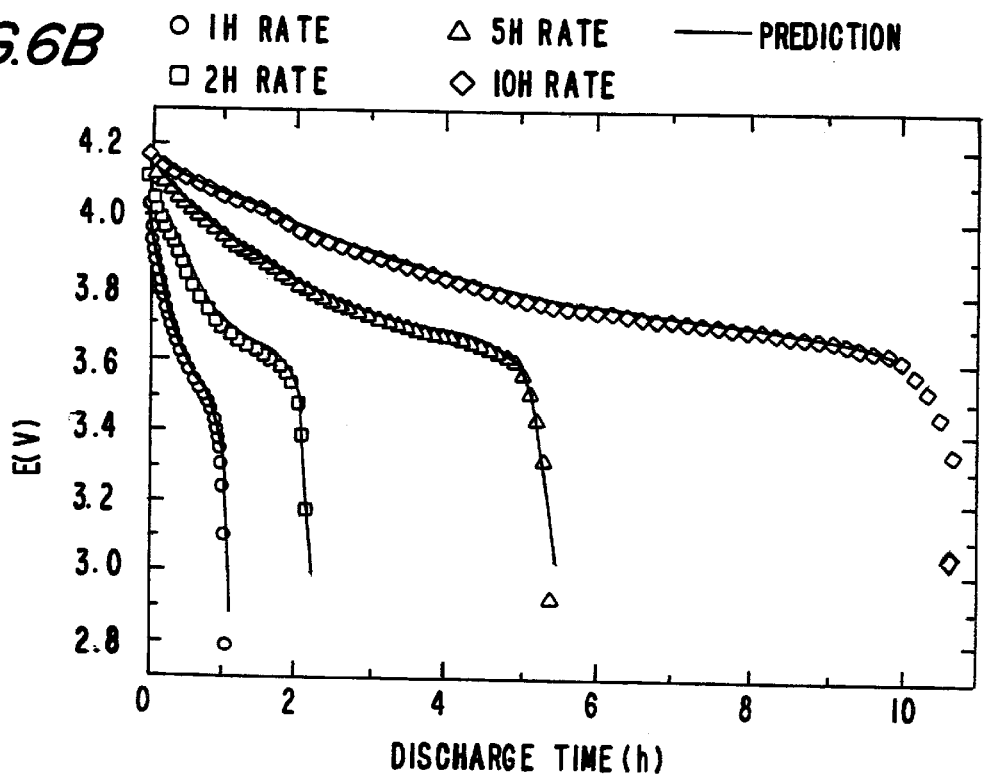

METHOD AND APPARATUS FOR DETERMINING CHARACTERISTIC PARAMETERS OF A CHARGE STORAGE DEVICE

TECHNICAL FIELD

The present invention relates to a method and apparatus for determining characteristic parameters of a charge storage device based on a wide frequency range of impedance measurements and a non-linear equivalent circuit model by which the parameters of the non-linear equivalent circuit model indicative of the characteristics of various charge storage devices such as a primary battery, secondary battery, capacitor, supercapacitor and fuel cell are determined.

BACKGROUND ART

In general, charge storage devices of all types such as a primary battery secondary battery capacitor, supercapacitor and fuel cell are manufactured in accordance with various product standards based on their material, size and type.

Rechargeable secondary batteries are classified further into lead-acid, nickel-cadmium, nickel-metalhydride, lithium ion and lithium polymer batteries according to their chemistry and material.

These secondary batteries are different in various aspects such as average discharge voltage, discharge voltage profile, internal resistance, limiting discharge current, temperature characteristics, charge cut-off voltage and the like.

In order to select a battery appropriate for the requirements of a particular application among various battery products, many kinds of factors are to be considered such as battery capacity, size, price of the product or the like including characteristics of the battery described above. As a reference for the choice of the battery for suitable application, it is required to use a method for quantitatively representing the performance of a battery.

For example, a battery used to drive a DC motor must have a drive voltage greater than the minimum operational voltage of the DC motor. A voltage drop caused by the internal resistance of the battery during operation has a very significant effect upon the operating time of the DC motor depending upon the size of the drive current.

For a battery used as a portable power source for a GSM or CDMA type cellular phone, precise analysis is needed for the characteristics of the battery in association with the discharge of periodic high current pulses. A rechargeable battery for an electric vehicle requiring instantaneous high power also has to be analyzed precisely particularly for a transient current response.

As a method to analyze the operational characteristics of a battery precisely, it is possible to examine and analyze the internal parameters related to the mechanism of the battery as well as general characteristics such as battery capacity, average discharge voltage, discharge voltage profile, internal resistance, temperature characteristic and charge cut-off voltage.

These internal parameters of a battery can be determined through measurement of the impedance characteristics of the battery at a wide range of frequency.

The present inventors have applied for a patent on an effective method for measuring and predicting battery capacity with the results of this study (Refer to. Korean patent application Nos. 22540 (1998) and 24134 (1998)).

The most effective method for selecting a battery for the appropriate purpose is to represent an application device including a specified battery as an equivalent circuit and then simulate it in a numerical manner.

This method can evaluate the efficiency and stability of the device by a virtual combination of a selected battery and an electric or electronic device as an electronic circuit using a computer.

For example, this type of numerical simulation of electric and electronic devices has been developed as a general computer program known as SPICE at California Berkely University in America and widely used in many research institutes and manufacturing companies.

A conventional equivalent circuit of battery is however oversimplified in construction and has been utilized for the simulation of devices rather than the battery itself.

The conventional equivalent circuit of battery is made up of a constant voltage source and serial resistors without consideration of the variation of discharge voltage over time. Thus the model works effectively only for a short period of discharge time under a DC current.

A method using the Peukert parameter disclosed in U.S. Pat. No. 4,952,862 is not appropriate to precisely describe the discharge characteristics of a battery since it employs a phenomenological model which simply approximates the discharge profile linearly at the initial stage of discharge and exponentially at the late stage of discharge.

A method for simulating a thermal battery as described in U.S. Pat. No. 5,428,560, which covers discharge voltage and internal resistance of the battery, is valid in a case of a long time DC discharge but cannot sufficiently describe the characteristics of the battery under transient conditions of discharge.

The non-linear circuit model of a battery suggested in the present invention is designed to calculate the voltage response of a battery with respect to a predetermined electrical load such as DC, AC, pulse or impedance, which implements a precise and effective simulation of the operational characteristics of electrical circuitry including a battery.

DISCLOSURE OF INVENTION

An objective of the present invention is to provide a method and apparatus for characterizing internal parameters of a charge storage device based on a wide frequency range of impedance measurements and a non-linear equivalent circuit model, which can be used for quality control of battery products and testing of batteries by analyzing or predicting the operational properties of charge storage devices such as a primary battery, secondary battery, capacitor, supercapacitor and fuel cell or condenser using computer, or can be used to determine the parameters of the non-linear equivalent circuit model of the charge storage device in order to design an electric/electronic device and batteries appropriate for this device through digital simulation of an electric circuit.

To accomplish the objective of the present invention, provided is a method and apparatus for characterizing internal parameters of a charge storage device based on a wide frequency range of impedance measurements and a non-linear equivalent circuit model, which is to experimentally characterize internal parameters of charge storage devices such as a primary battery, secondary battery capacitor, supercapacitor and fuel cell, the method including the steps of: (1) measuring voltage and current characteristics by applying a voltage/current having a predetermined discharge rate to the capacitor to charge/discharge the capacitor; (2)

measuring a characteristic impedance spectrum in a predetermined range of frequency from the current and voltage applied to both terminals of the capacitor or a directly connected impedance load in a plurality of charge states within the entire charge/discharge interval; and (3) characterizing the parameters of the non-linear equivalent circuit model of the charge storage devices from the voltage characteristic measured in step (1) and the impedance spectra in the predetermined range of frequency measured in step (2). The present invention suggests the numerical model and the equivalent circuit of a battery for accurately prediction and description of the operational performance of the battery under well-defined battery charge/discharge conditions within 100 percent depth of discharge, such as DC discharge of at least C/0.5 discharge rate, AC discharge in the MHz to 20 kHz range of frequency, current density corresponding to at least C/0.5 rate, pulse discharge in the same frequency range, or discharge for a fixed or variable impedance load. The present invention implements methods of experimental measurement, numerical analysis and nonlinear equivalent circuit, and an apparatus for the measurement and analysis.

BRIEF DESCRIPTION OF DRAWINGS

FIG. 5 is a signal flow chart showing a parameterization method of the present invention;

FIG. 6A is a graph showing experimental and simulation results of discharge characteristics at various discharge rates for a lithium ion battery manufactured by Sony;

FIG. 6B is a graph showing experimental and simulation results of discharge characteristics at various discharge rates for a lithium ion battery manufactured by Matsushita;

BEST MODE FOR CARRYING OUT THE INVENTION

Hereinafter, a method and apparatus for characterizing internal properties of a charge storage device based on a wide frequency range of impedance measurements and a non-linear equivalent circuit model according to the present invention will be described in detail with reference to the accompanying drawings.

Figure 1:
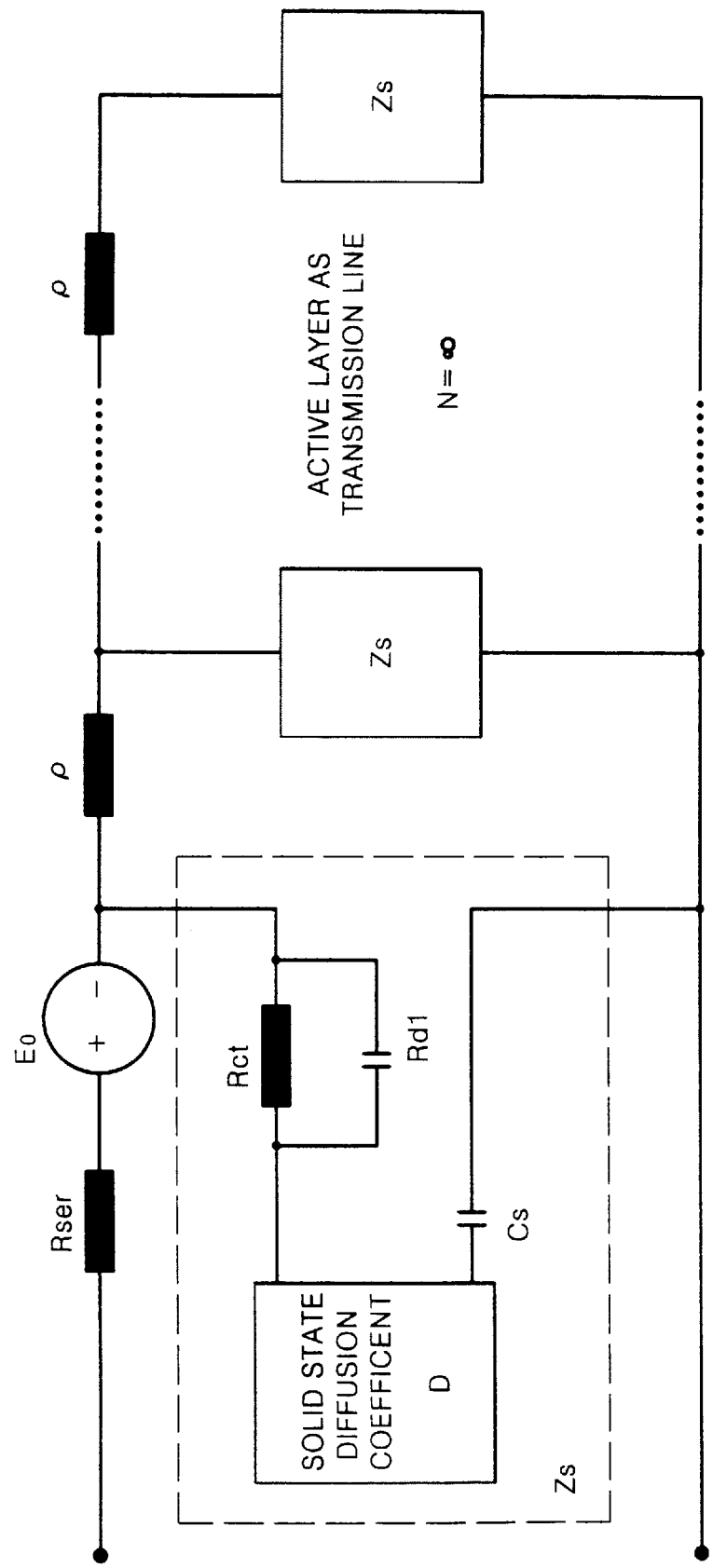
FIG. 1 is an equivalent circuit diagram based on the transmission line model of a battery.

The equivalent circuit model of a battery proposed in the present invention is a circuit model in which the electrochemical mechanism associated with active layers of the anode and cathode constituting the battery is described with a transmission line model as shown in FIG. 1.

FIG. 1 is an equivalent circuit diagram for a transmission line model which is made up of macroscopic resistance $\rho$ of electrode active layers, impedance $Z_s$ of thin electrode layers cut infinitely in the vertical direction to a current collector, and serial resistance $R_{ser}$ relevant to the interconnecting resistance through electrolyte, current collectors and wires.

In FIG. 1, impedance $Z_s$ of electrode layers is expressed by an equivalent circuit made up of solid state diffusion coefficient D inside the electrode-forming particles, charge storage capacitance $C_s$ corresponding to the chemical reaction associated with energy storage, double layer capacitance $C_{dl}$, and charge transfer resistance $R_{ct}$.

Such a circuit model is proven to be effective in describing the discharge mechanism of active materials such as lithium intercalation compounds.

In a case where the cathode and anode of the battery can be described by the same model, the equivalent circuit model having the electrodes in series can be of the same form.

The equivalent circuit of a single battery comprising cathode and anode can be constructed in consideration of the impedance of electrolyte as serial resistance $R_s$.

Figure 2:
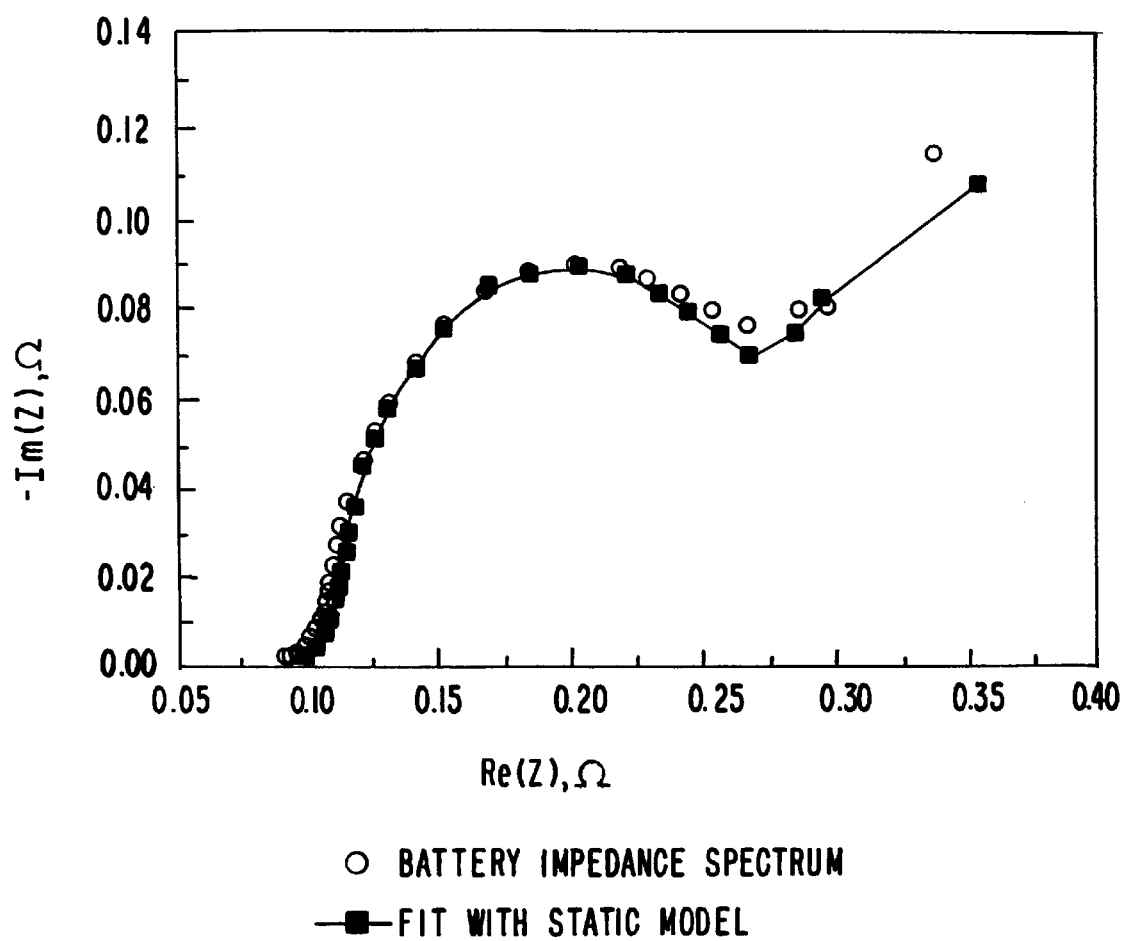
FIG. 2 is a graph in which an impedance spectrum measured in a fully charged lithium ion battery (manufactured by Sony) is compared to an impedance spectrum derived from parameters obtained by fitting to a static equivalent circuit model.

The validity of a static equivalent circuit model comprising linear elements such as a resistor and a capacitor at given state of a charge of battery can be verified as shown in FIG. 2 by measuring the impedance spectrum of the battery and then by fitting the spectrum to the equivalent circuit by using complex nonlinear least square method. From that result, the characteristic factors are determined.

This static equivalent circuit model is valid only when the change of battery state is small. If the discharge time is long or the discharge current is high, however, consideration must be taken of the nonlinear variation of parameters on the state of charge of the battery.

The impedance spectrum for several state of charge of the battery is measured and analyzed within the entire discharge interval of the battery, so that the parameters for the static equivalent circuit are determined as a function of the state of charge.

On the other hand, charge storage capacitance $C_s$ normally has a large value and is difficult to measure within an appropriate period of time through the impedance method.

Accordingly, a discharge voltage curve is obtained for the entire discharge interval of the battery, and the charge storage capacitance $C_s$ is determined from the slope of discharge voltage profile.

The non-linear equivalent circuit model designed in consideration of the nonlinear variation of parameters depending upon the state of charge of the battery, as shown in FIG.

3, comprises the finite number of ladder-type two-terminal networks in place of the transmission line, and nonlinear resistors and nonlinear capacitors whose values depends upon voltage influenced by charge storage capacitance $C_s$.

A method of numerical simulation of operation voltage or current of a battery provided by the present invention can be achieved by directly solving the corresponding system of non-linear first order differential equations or by using the finite-difference method used in an electronic simulator such as SPICE.

The desired precision of the solution can be obtained by control of the number of ladder-type two-terminal networks representing the transmission line.

The results of simulation based on the non-linear equivalent circuit model of a battery correspond to the experimental results of measurement for the discharge characteristics of a battery with accuracy, which will be later described in detail with reference to the embodiments.

A method of obtaining parameters in the non-linear circuit model of a battery proposed in the present invention will now be described.

A battery for testing is fully charged by following predefined procedure, and the impedance spectrum is measured in a certain range of frequency after the open circuit voltage of the battery reaches its equilibrium.

Provided that the total number of impedance measurements at different states of charge is N, the battery is discharged by the amount of charge Q/(N−1) at a constant current I where Q is the discharge capacity of the battery. After the open circuit voltage of the battery reaches the equilibrium again, the next measurement of impedance spectrum is performed. Such a procedure of discharge and impedance measurement is repeated until the battery reaches the predefined end of discharge.

In this procedure, the discharge rate of the battery can be selected within a range that the dE/dq of discharge voltage E according to the change in the amount of discharge q of the battery is not changing as discharge rate as further decreased. Normally C/10 rate can be applied.

One of the parameters, charge storage capacitance $C_s$ is calculated by multiplying dE/dt of discharge voltage E over time t by current I.

The range of frequency in the measurement of impedance must be wide enough to provide information concerning time constants associated with the electrochemical reaction of the battery.

The high frequency region is usually limited to about 60 kHz due to the linearity of an electrochemical system, but actually for a battery it is limited to 10 kHz corresponding to a pulse of 0.1 msec interval for a battery.

The low frequency limit is determined from the specification of a measurement instrument and the time required for measurement. The lowest frequency is important to describe accurately the change of parameters associated with the reaction characteristic of the battery for the entire discharge interval. The lower frequency is usually near 1 mHz.

A frequency response analyzer (FRA) has been typically used for a method of measuring an impedance spectrum in which the frequency is sequentially scanned to obtain the impedance from input and output signals.

The FRA, however, has a disadvantage in that too much time is required for measurement because the frequency scan is performed one by one from the minimum frequency to the maximum.

Another method for measuring impedance spectra is a Fourier transform method in which a perturbation current signal is applied to both terminals of a battery under galvanostatic condition and a voltage response signal recorded in time domain is Fourier-transformed to frequency domain to calculate the impedance impedance spectrum.

The perturbation current signal used as an input signal can be obtained by superposition of multiple sine waves at selected frequencies.

If the minimum frequency of measurement is $f_{min}$, for example, the perturbation current signal has an odd multiple of the minimum frequency $f_{min}$ such as $3f_{min}$, $5f_{min}$, $7f_{min}$ or the like. This Fourier transform method using non-overlapping multiple frequencies is different from another Fourier transform method using a pulse (U.S. Pat. No. 5,633,801).

The principle of the measurement is described in detail by G. S. Popkirov and R. N. Schindler, Rev. Sci. Instrum., 63, 5366 (1992).

The maximum frequency measurable through the Fourier transform method using non-overlapping multiple frequencies is limited depending upon the sampling time of a signal detector. The time required for measurement corresponds to twice of the inverse of the lowest measurement frequency, because of waiting time necessary for excluding transient effects.

Compared to the FRA, the Fourier transform method is advantageous in that the time required to measure the impedance is reduced by half or more.

Linearity of measured system is preserved if amplitudes of selected frequencies are at least 3 orders of magnitude larger than that of additional frequencies obtained during Fourier-transform impedance measurement.

The linearity of a measured system at given current applied to the battery in the case of Fourier transform impedance measurement can be checked by comparing the amplitude of complex voltages for a selected frequencies and additional frequencies.

Another method for measuring impedance spectra is to use a simple current waveform instead of multiply superposed perturbation current signals.

For example, a constant current $I(t)=I_0$ is applied to both terminals of a battery and a linear or non-linear least square regression is performed based on the Laplace transform of response voltage signal and input current measured in time domain to calculate the impedance spectrum.

If the sampling time is $t_{samp}$ and the time required for measurement is $t_{mes}$, the valid frequency range is $\frac{1}{2}t_{mes}$ to $\frac{1}{2}t_{samp}$.

Assuming that the sampling speed is 1 kHz and the time for measurement is 500 sec, for example, the frequency range is 1 mHz to 500 Hz.

This demonstrates that the time required for measurement is shorter than that in the Fourier transform method, 2000 sec., because no waiting time is necessary to remove transient effects.

If I(s) is the Laplace transformed function of I(t), the impedance function in a Laplace space is Z(s)=V(s)/I(s).

The Laplace transformed impedance spectrometer is advantageous in that a desired spectrum can be obtained by numerical analysis faster than the FRA or Fourier transform method.

The parameters except for charge storage capacitance Cs are determined by fitting of the impedance spectrum measured at different state of charge of a battery to the static model. The algorithm used for fitting can be made of complex non-linear least square fitting described in J. R. Macdonald, J Schoonman and A. P. Lehnen, Solid State Ionics V5, 137(1981), or non-linear fitting using a neural network or any other suitable fitting methods.

The initial conditions used in the fitting may be arbitrarily chosen and, if the result of the previous fitting is used as initial conditions for the successive fitting, the performance and quality of the fit can be improved.

Figure 4:
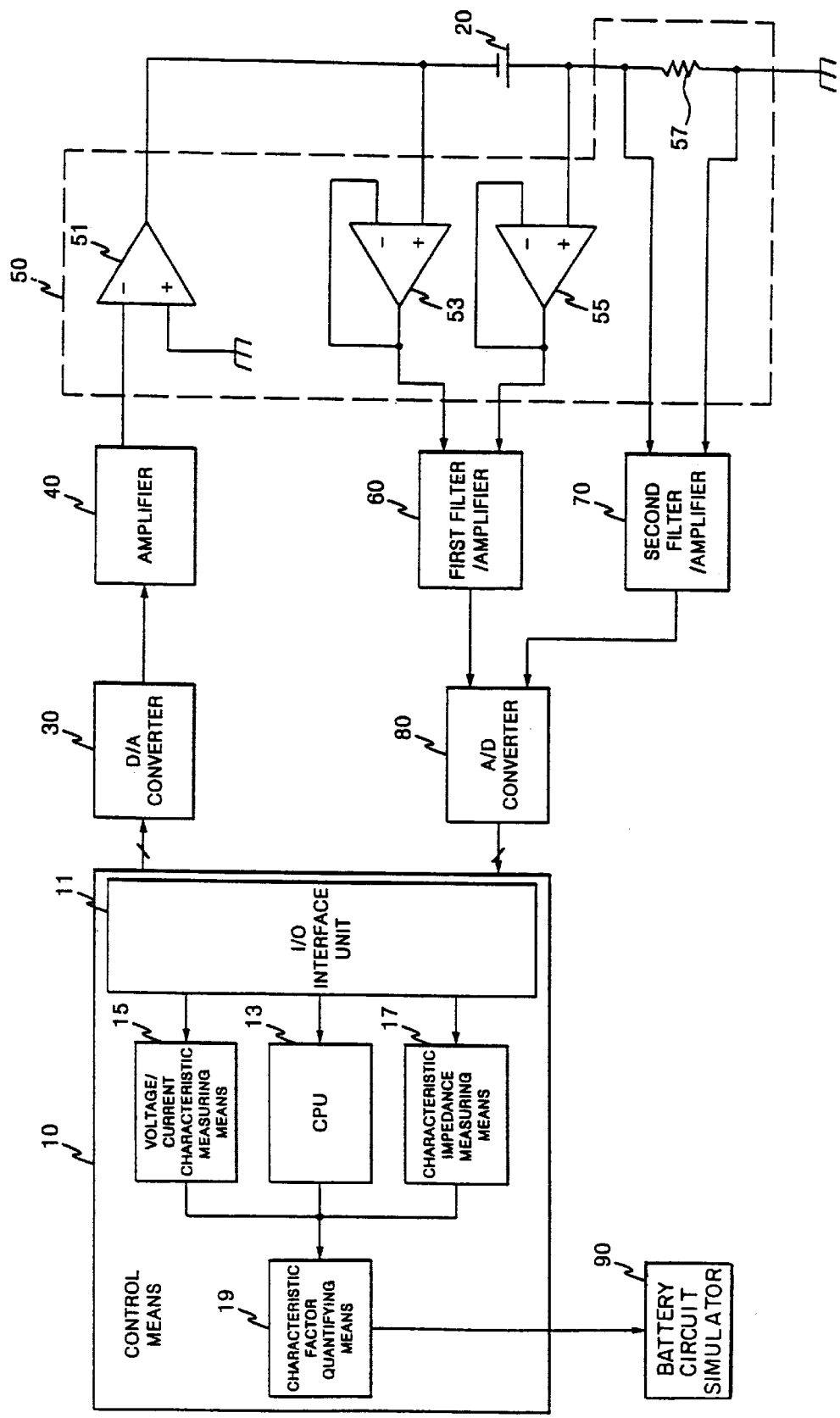
FIG. 4 is a block diagram showing the construction of an apparatus for characterizing parameters of a charge storage device in the present invention.
Figure 6C:
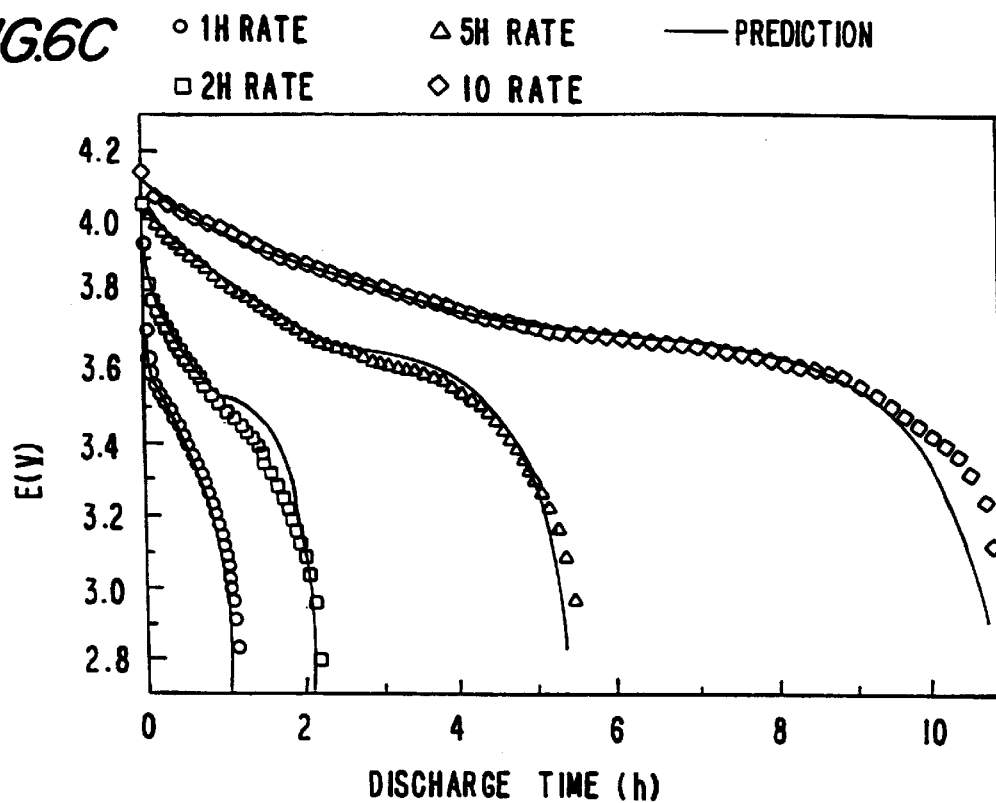
FIG. 6C is a graph showing, experimental and simulation results of discharge characteristics at various discharge rates for a lithium ion battery manufactured by Sanyo.
Figure 6D:
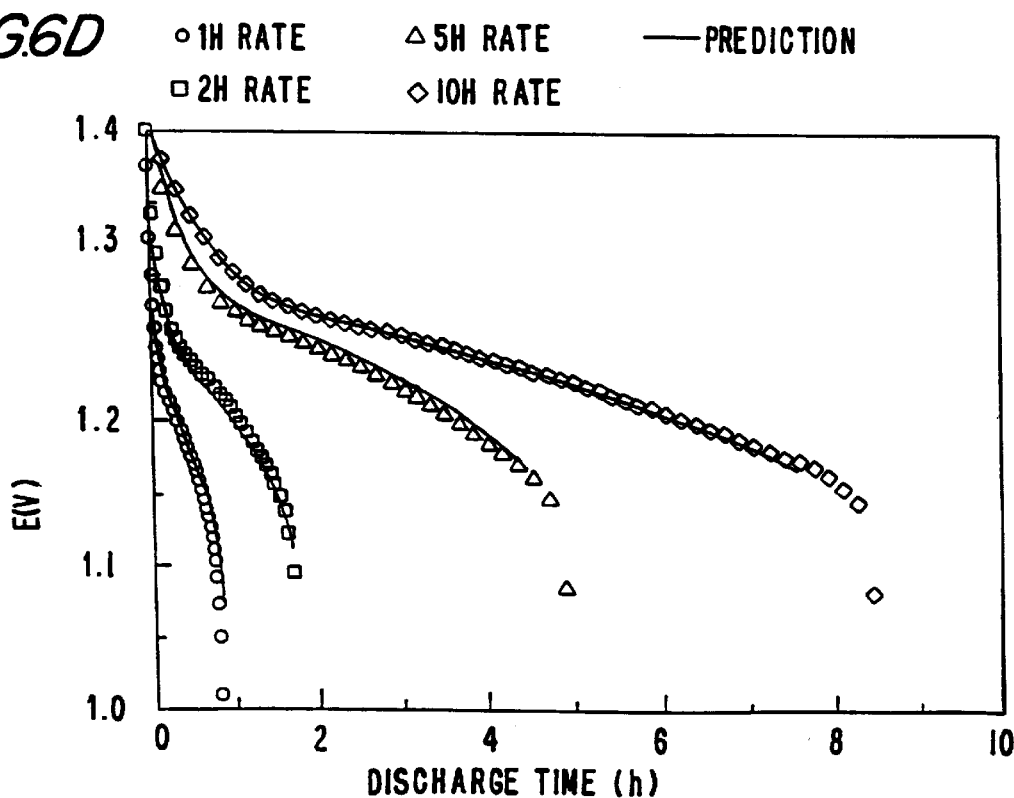
FIG. 6D is a graph showing experimental and simulation results of discharge characteristics at various discharge rates for a nickel hydrogen cell manufactured by Hitachi.

FIG. 4 is a block diagram showing the construction of a battery parameterization system apparatus according to the present invention.

In the figure, reference numeral 10 denotes control means of determining parameters of charge storage device 20 with a computer or the like and simulating various operational characteristics of an electronic circuit including battery.

The control means 10 has an I/O interface unit 11 for interfacing the charge storage device 20, a central processing unit(CPU) 13 for controlling the measurement of voltage, current, and impedance for the charge storage device 20, a voltage/current measuring means 15 for measuring the voltage and current characteristics of the charge storage device 20 under the control of the central processing unit 13, a characteristic impedance measuring means 17 for measuring the impedance of the charge storage device 20 under the control of the central processing unit 13, and a parameterization means 19 for obtaining the parameters of the non-linear equivalent circuit model of the charge storage device 20 with the voltage and current characteristics of the charge storage device 20 measured by the voltage/current characteristic measuring means 15 and the characteristic impedance of the charge storage device 20 measured by the characteristic impedance measuring means 17.

Reference numeral 30 denotes a digital-to-analog (D/A) converter for converting voltage and current data output from the control means 10 via the interface unit 11 into analog signals, reference numeral 40 denotes an amplifier for amplifying the output signal of the digital-to-analog converter 30, reference numeral 50 denotes a galvanostat for feeding the output signal of the amplifier 40 into the capacitor 20 to output the voltage and current of the capacitor 20.

The galvanostat 50 has an inversion amplifier 51 for inversion amplifying the output signal from the amplifier 40 and applying it to the charge storage device 20, buffers 53 and 55 for generating voltages at both terminals of the charge storage device 20, and a current-detecting resistance 57 connected in series to the charge storage device 20 for detecting the current of the charge storage device 20.

Reference numerals 60 and 70 denote first and second filters/amplifiers for filtering and amplifying the voltage of the charge storage device 20 output from the buffers 53 and 55 of the galvanostat 50 and the voltage based on the current of the charge storage device 20 detected by the current-detecting resistor 57, respectively. Reference numeral 80 represents an analog-to-digital (A/D) converter for converting the output signals of the first and second filters/amplifiers 60 and 70 into digital signals and applying them to the I/O interface unit 11 of the control means 10.

Reference numeral 90 denotes a battery circuit simulator for simulating different operational characteristics according to the values of the parameters obtained by the parameterization unit 19 of the control means 10 for a specified battery circuit including the same battery as the charge storage device 20.

If the voltage and current characteristics are measured first in the battery parameterization system of the present invention with such a construction, the control means 10 has the voltage/current characteristic measuring means 15 outputting voltage and current digital data of a predetermined level via the I/O interface unit 11 under the control of the central processing unit 13.

The digital voltage and current data are converted into analog signals at the digital-to-analog converter 30, boosted through the amplifier 40, inversion amplified via the inversion amplifier 51 of the galvanostat 50 and then applied to the charge storage device 20. Thus voltage and current based on the digital output data from the voltage characteristic measuring means 15 are produced in the charge storage device 20.

After a predetermined period of time under conditions described above, the control means 10 applies the voltage and current of the charge storage device 20 to galvanostat 50, first and second filters/amplifiers 60 and 70, and analog-to-digital converter 80.

The voltages at both terminals of the charge storage device 20 are fed into the first filter/amplifier 60 via buffers 53 and 54 of the galvanostat 50, while the current of the charge storage device 20 flows through the current-detecting resistor 57 in such a manner that a voltage drop occurs in the current-detecting resistor 57. The voltages at both terminals of the resistor 57 based on the current flowing through the current-detecting resistor 57 are input to the second filter/amplifier 70.

Then the first and second filters/amplifiers 60 and 70 filter the voltages at both terminals of the capacitor 20 and the detected voltage based on the current of the charge storage device 20 to remove noises and for amplification respectively. The output signals of the first and second filters/amplifiers 60 and 70 are converted into digital data at the analog-to-digital converter 80 and applied to the I/O interface unit 11. The voltage/current characteristic measuring means 15 is receptive to the digital data from the voltages at both terminals of the charge storage device 20 and the detected voltage based on the current of the charge storage device 20, which voltages are applied to the I/O interface unit 11, and then measures the voltage and current characteristics of the charge storage device 20.

The control means 10 can use a separate voltage/current generator (not shown) without generating voltage and current digital data to charge the charge storage device 20 directly, so that the voltage/current generator outputs predetermined voltage and current, charging the charge storage device 20 under the control of the control means 10.

The characteristic impedance measuring means 17 measures the characteristic impedance of the charge storage device 20 under the control of the central processing unit 13.

The measurement of the characteristic impedance includes FRA, Fourier transform and Laplace transform methods, one or more of which may be used solely or in combination in measurement of the characteristic impedance.

In the FRA method using the sine waves of predetermined frequency, digital data at a predetermined frequency is output and applied to the charge storage device 20 via digital-to-analog converter 30, amplifier 40 and galvanostat 50 sequentially to charge the charge storage device 20. The voltage and current of the charge storage device 20 are input and stored in the control means 10 through galvanostat 50, first and second filters/amplifiers 60 and 70 and analog-to-digital converter 80.

After the completion of such a measurement for one predetermined frequency, the digital data of another frequency are output in sequence, and subsequently, the voltage and current of the charge storage device 20 are measured and stored.

In the Fourier transform method, the voltage or current digital data in the specified form is stored beforehand. The stored digital data is applied to the charge storage device 20 through digital-to-analog converter 30, amplifier 40 and galvanostat 50 in sequence, or signals based on the digital data are generated from a separate voltage/current generator and applied to the charge storage device 20.

The voltage and current of the capacitor 20 based on the applied signals are input and stored in the control means 10 via galvanostat 50, first and second filters/amplifiers 60 and 70 and analog-to-digital converter 80.

When the measurement of the characteristic impedance of the charge storage device 20 is completed. Fourier transform and/or Laplace transform, the central processing unit 13 converts the stored result of measurement into a complex impedance value as a function of frequency.

After a predetermined number of the repeated measurements for the voltage characteristic and the characteristic impedance, a numerical differentiation of discharge curve and complex non-linear least square fitting are performed in parameterization unit 19 and the characteristic impedance values of charge storage device in order to obtain the parameters of the non-linear equivalent circuit.

The obtained parameters are used to simulate various operational properties of the charge storage device in the charge and discharge process at arbitrary load by using an electronic circuit simulator 90.

Simulation can be performed for the operational characteristics of a circuit including battery, e.g., pulse, AC, impedance and transient characteristics as well as standard characteristics of a battery, e.g., constant voltage or constant current charge/discharge characteristics.

The control means 10 is, for example, made up of a computer system or hardware which is capable of obtaining parameters of the charge storage device 20 and simulating various operational characteristics of an electronic circuit including a charge storage device by using the parameters.

FIG. 5 is a signal flow chart showing a method for obtaining parameters of the charge storage device 20 with control means 10 that is made up of a computer system.

As illustrated in FIG. 5, when the power is ON, the hardware makes a diagnosis of itself and becomes initialized, in step S10. Control variables are input, in step S12.

The control variables to be input include sampling rate, measurement mode, voltage, current, memory size, gain, and the like.

A measurement mode is activated in step S14.

If voltage/current measurement is chosen in step S14, a control variable corresponding to voltage/current measurement is set among the input control variables (S16) and the voltage/current is output to charge the charge storage device 20 (S18). The voltage/current of the charge storage device 20 is input and stored, in step S22.

A decision is made upon as to whether or not the measurement is completed, in step S24. If the decision indicates that the measurement is uncompleted, the flow of the process goes back to step S14 in which the measurement mode is selected and activated.

If frequency scan is chosen in step S14, a control variable corresponding to the frequency scan is set (S26) and a signal of one frequency among a plurality of predetermined frequencies is output to charge the charge storage device 20 (S28). The voltage and current of the charge storage device 20 are then input, in step S30.

Use is made of amplitude/phase shift or Fourier transform method to calculate the value of the input voltage/current, in step S32, and impedance Z(f) is determined from the calculated voltage/current value, in step S34.

In step S36, a charge storage device is made upon as to whether or not the measurement of predetermined entire frequencies is completed. If the decision indicates that the measurement is not completed, the flow of the process returns to step S28 in which a signal of the next predetermined frequency is output and the procedures for measuring the voltage/current and then performing a calculation on the impedance Z(f) are repeated.

When the decision made in step S36 indicates that the measurement of predetermined entire frequencies has been completed, the impedance Z(f) determined is stored in step S38.

If Fourier transform is chosen in step S14, a control variable corresponding to the Fourier transform is set (S40) and a perturbation signal of multiply selected frequencies is output to perturb the charge storage device 20 (S42). The voltage and current of the charge storage device 20 are input, in step S44.

In step S46, Fourier transform is performed to calculate V(t) and I(t). The power spectrum of V(t) and I(t) is then determined (S48), and impedance Z(f) is calculated (S50) and stored (S52).

If Laplace transform is chosen in step S14, a control variable corresponding to the Laplace transform is set (S54) and voltage and current data in a specified form is output to charge the charge storage device 20 (S57). The voltage and current of the charge storage device 20 are input in step S58.

In step S60, linear regression is performed to calculate V(t) and I(t). After determination of impedance Z(f) in step S62, the error function of impedance Z(f) is calculated (S64) and stored (S66).

When the parameters are measured by frequency scan, Fourier transform and/or the Laplace transform method after measurement of voltage/current, the parameterization is performed (S68) and print out the result as a file or graph.

The present invention method and apparatus for battery parameterization system will now be described with reference to preferred embodiments.

Embodiment 1

An apparatus for successively measuring the constant current discharge of a battery and impedance spectrum by the Fourier transform method in a repeated manner is constructed as follows.

The apparatus is designed to perform a repetitive procedure for applying a predetermined current (for example, C/10) to a battery by using a galvanostat for a defined period of time, reading out the voltage value measured on terminals of the battery, and measuring the impedance spectrum of the battery in that state by using a Fourier transform impedance spectrometer.

The impedance spectrometer is constructed in a way to apply an input current signal having overlapped sine waves of frequencies which are a multiple of the minimum frequency to the battery via 16-bit digital-to-analog converter and galvanostat, transfer the measured digital current and voltage signals to a computer with a two-channel 16-bit analog converter, and perform a calculation on complex impedance by using a digital discrete Fourier transform algorithm.

Figure 3:
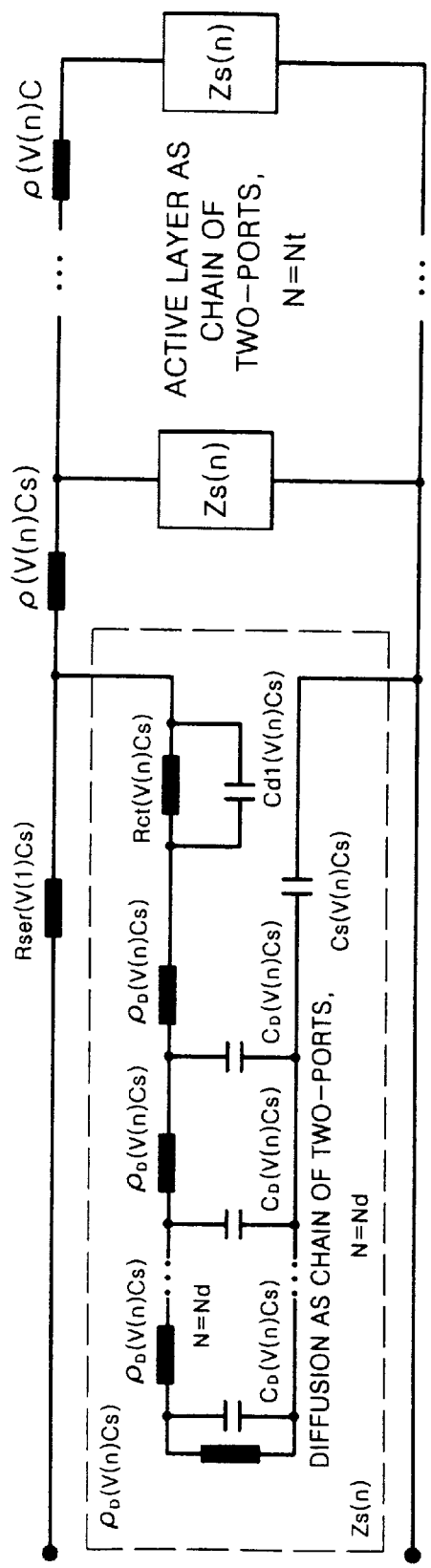
FIG. 3 is a dynamic model of an equivalent circuit considering nonlinear behavior of model parameters at each state of charge of a battery.

In the impedance spectrum and the voltage curve that are obtained through a predetermined number (for example, ten) of the serial experiments as described above and parameters of static model (FIG. 1) are obtained for each spectrum, system of the non-linear ordinary differential equation corresponding to the dynamic circuit model shown in FIG. 3 is solved to simulate performance of a battery under different load conditions.

At this stage, $N_d=8$ and $N_r=4$ in FIG. 3. The Livermore stiff ordinary differential equation solver is used to solve the system of ordinary differential equations.

This calculation takes about 10 min. by using a personal computer with pentium processor.

The predescribed method is applied to all four secondary batteries, three types of lithium ion batteries having the regulated capacity of 1300 mAh (manufactured by Sony, Sanyo Electric Co., Matsushita Electric Co.) and one type of nickel hydrogen accumulator having the regulated capacity of 1300 mAh (manufactured by Hitachi), in which the Fourier transform impedance spectrometer as described in Embodiment 1 is used to obtain 10 impedance spectra measured at each state of charge decreased by 130 mAh until the batteries are completely discharged.

With the voltage curve and the impedance spectra in each state of charge, the differentiation and complex nonlinear least square fitting is performed as described in Embodiment 1 to calculate the parameters for the respective states of charge.

Table 1 shows the set of parameters for each battery in the full charge state.

TABLE 1

| Battery | Sony | Matsushita | Sanyo | Hitachi |
| --- | --- | --- | --- | --- |
| $R_{ct}$ (Ω) | 0.069 | 0.019 | 0.14 | 0.012 |
| $C_{dl}$ (Farad) | 1.36 | 0.652 | 41.1 | 4.39 |
| $C_{ps}$ (Farad) | 41.42 | 2887 | 98.7 | 5049 |
| $\rho$ (Ω) | 0.083 | 0.045 | 987 | 0.001 |
| $R_{ser}$ (Ω) | 0.070 | 0.081 | 0.047 | 0.030 |
| D (m$^2$sec$^{-1}$) | $9.5 \times 10^{-4}$ | $3.6 \times 10^{-3}$ | $91 \times 10^{-3}$ | $2.8 \times 10^{-3}$ |
| E (Volt) | 4.2 | 4.19 | 4.15 | 1.4 |
| $C_s$ (Farad) | $4.65 \times 10^3$ | $1.02 \times 10^3$ | $1.51 \times 10^3$ | $3.09 \times 10^3$ |

Embodiment 2

The discharge curve of each battery is obtained at discharge rates of 10 h, 5 h, 2 h and 1 h with the characteristic factors of four batteries calculated in Embodiment 1 and the battery circuit model shown in FIG. 3 through the prescribed numerical simulation.

A constant current corresponding to each discharge rate is applied to each battery and the voltage at this moment is read out and output so as to obtain the discharge characteristics of each battery at each discharge rate experimentally. Thus, the discharge characteristics obtained are compared to the results of simulation, as shown in FIGS. 6A–6D.

As shown in FIGS. 6A–6D, the results of simulation are consistent with those of experiment in all cases.

Embodiment 3

Another advantage of the present invention lies in that the transient discharge characteristics of a battery under application of current pulses can be predicted.

A discharge current is applied to a fully charged lithium ion battery having a regulated capacity of 1300 mAh (manufactured by Sony) at a discharge rate of 2 hrs and placed in an open circuit for 900 sec to restore the voltage.

Charge and discharge pulse currents with a duration of 400 sec are applied to the battery at a discharge rate of 10 h again.

With the above-specified current being applied virtually to the battery cell model of Sony lithium ion battery obtained in Embodiment 1, the system of ordinary differential equations is solved through a numerical analysis for the change of voltage.

Figure 7:
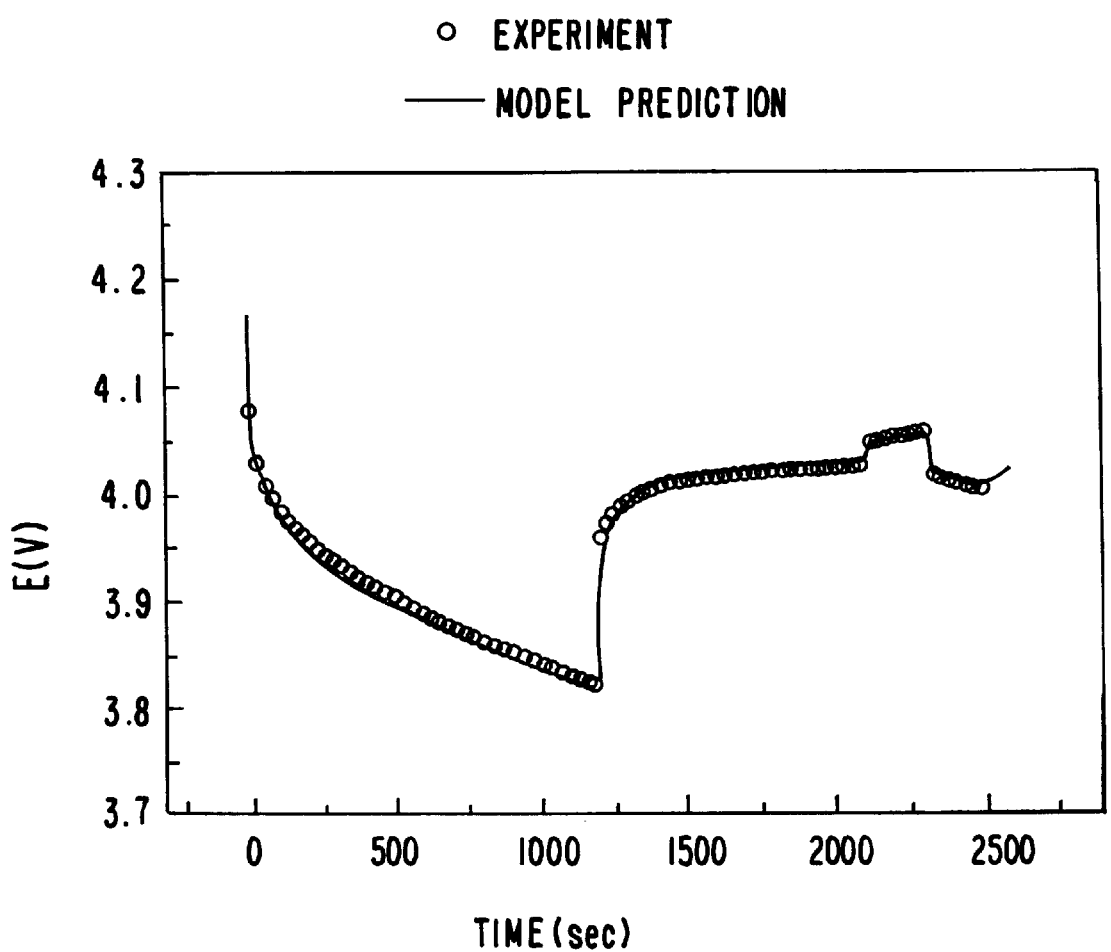
FIG. 7 is a graph showing experimental and prediction results of transient discharge characteristics upon on pulse currents applied to a lithium ion battery manufactured by Sony.

During measurement, voltage and current are read out and compared to the results of simulation, which is shown in FIG. 7.

As shown in FIG. 7, the results of experiment exactly correspond to those predicted.

Embodiment 4

The present invention makes it possible to predict the change of voltage and various electrical characteristics of an electrical load when a battery is connected to any type of electrical load.

A DC motor is connected to a fully charged lithium ion battery having a regulated capacity of 1300 mAh (manufactured by Sony), and the rotation speed and the operational voltage of the motor are measured.

To measure the rotation speed of the DC motor, the front end of the DC motor is connected to an optical chopper and the frequency of a light signal is measured.

Figure 8:
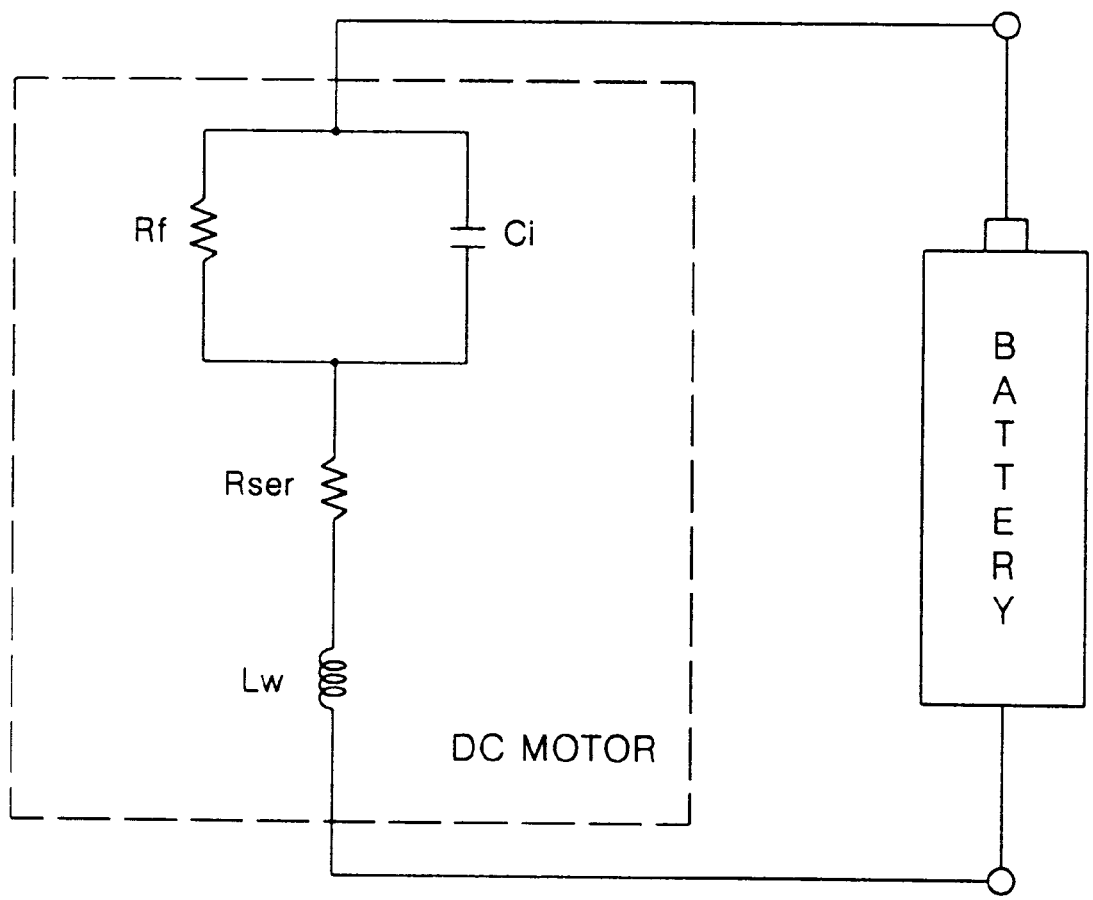
FIG. 8 is an equivalent circuit diagram used to predict the operation of a DC motor powered by a battery.

The internal parameters of the DC motor used in the experiment are determined by establishing an equivalent circuit consisting of capacitor and inductor, as illustrated in FIG. 8, and measuring the impedance characteristic.

The change of voltage is simulated as a function of time from the battery circuit model of the Sony battery obtained in Embodiment 1 and the equivalent circuit of the DC motor. The rotation speed of the motor is predicted from the chance of voltage and compared to the experimental values, which are shown in FIGS. 9A and 9B.

Figure 9A:
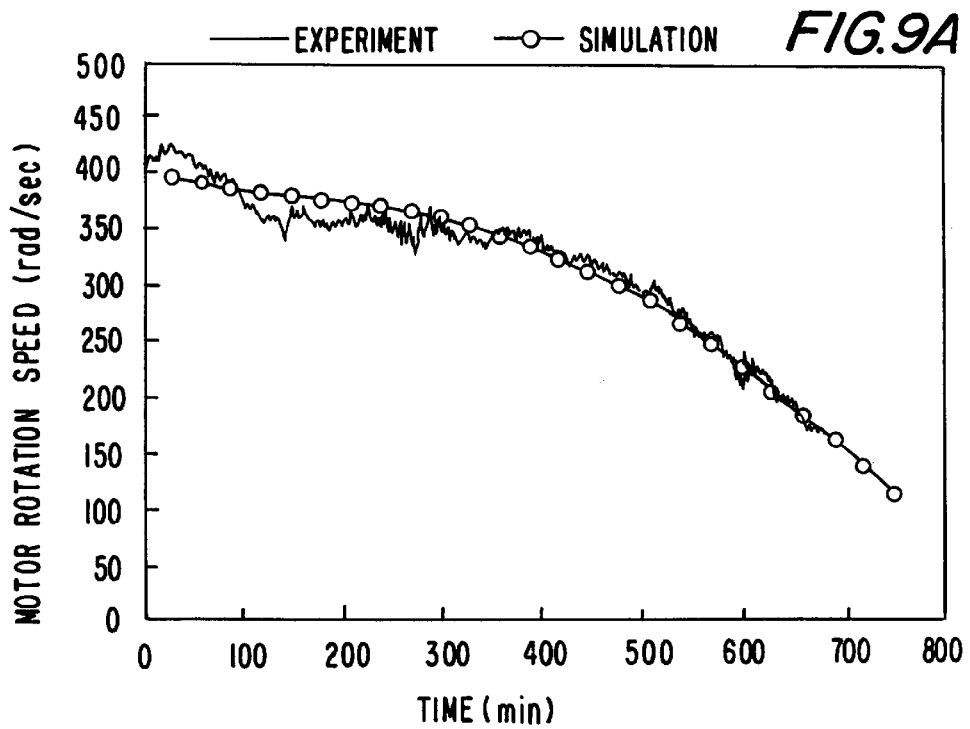
FIG. 9A is a graph showing experimental and prediction results of the rotation speed of a DC motor connected in series with a battery.
Figure 9B:
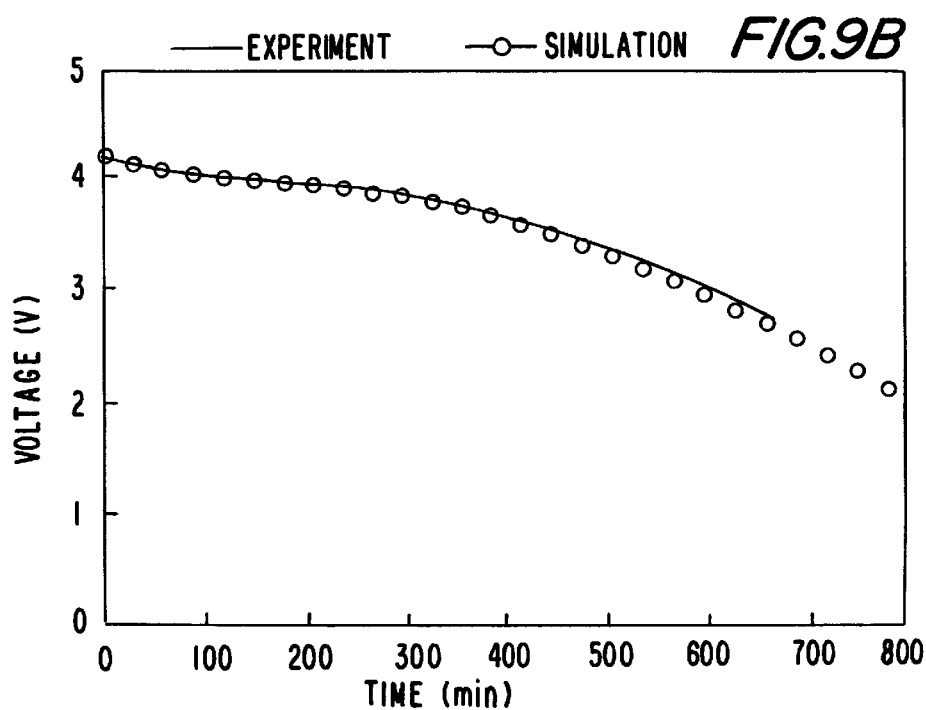
FIG. 9B is a graph showing experimental and prediction results of the discharge voltage of a battery connected in series with a DC motor.

As shown in FIGS. 9A and 9B, the results of experiment are exactly in accord with those predicted.

Embodiment 5

Using the battery circuit model of a single battery, the discharging characteristics of a battery pack consisting of a plurality of parallel or serial batteries are predicted and compared to the results of experiment.

Four lithium ion batteries having the same nominal capacity of 1300 mAh (manufactured by Matsushita) are used. The lithium ion batteries are divided into two groups, where each of the groups has two lithium ion batteries connected with each other. The two groups are connected in parallel with each other to constitute a battery pack. While the battery pack is subjected to a discharge at a discharge rate of 10 h, the voltage is measured.

On the other hand, the discharge voltage of the battery pack is simulated based on the circuit model of the Matsushita lithium ion battery obtained in Embodiment 1. The predicted values are shown in FIG. 10.

Figure 10:
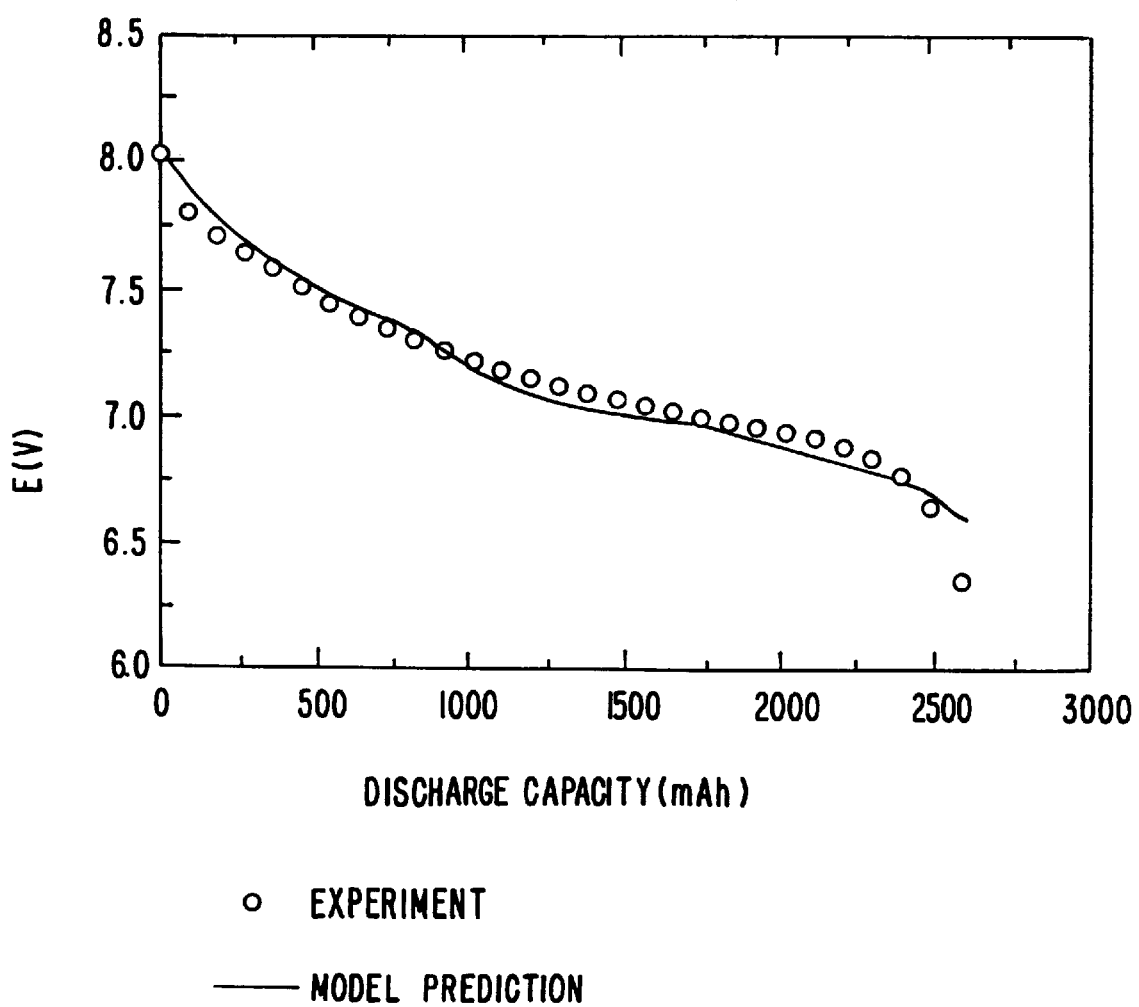
FIG. 10 is a graph showing experimental and prediction results on the discharge characteristics of a battery pack comprising four serial and parallel lithium ion cells manufactured by Matsushita.

As shown in FIG. 10 the results of simulation exactly correspond to those of experiment. Although the present invention has been described with reference to the preferred embodiments of specified cases and methods for the purpose of detailed description, the invention is not limited to these preferred embodiments and includes within the scope of the appended claims all equivalent methods.

For example, another measurement method may be applied instead of the prescribed Fourier or Laplace transform methods in the measurement of the impedance spectrum. Independent measurement can be performed in order to obtain a discharge curve through experimental means. It is also possible to determine parameters by direct fit of the time domain response signal of voltage and current to be measured in the experiment for impedance for determining the parameters to another algorithm.

Another type of charge storage device such as primary cell or capacitor may be analyzed based on the same circuit model.

Other various methods for numerical analysis can be adapted in the process for obtaining the numerical solution for the operational characteristics of a battery equivalent circuit. Especially, in the process using the transmission line model, the system of differential equation can be directly solved or another numerical method describing the transmission line model can be introduced instead of using a ladder-type four-terminal network.

Industrial Applicability

Use of the numerical model of a battery proposed in the present invention enables a precise diagnosis of a specified battery and may be used for the purpose of quality control in the manufacture of a battery or examination of battery conditions in application devices.

Furthermore, with the battery numerical model of the present invention, a simulation can be performed on the voltage response characteristics of the battery for an electrical load such as DC, AC, pulse or impedance. A combination of the numerical model with a common electric circuit digital simulator like SPICE enables a simulation of the operational performance of the electrical circuit.

The electrical circuit simulation method based on the numerical model of a battery according to the present invention is applicable to the design of various electric/electronic devices using batteries such as computing devices, communication apparatus, power tools for driving a motor with batteries, electric vehicles, and batteries appropriate to these devices.

What is claimed is:

1. A method of determining characteristic parameters of a charge storage device, based on a wide frequency range of impedance measurements and a non-linear equivalent circuit model, which is used to obtain the parameters of the charge storage device such as a primary battery, secondary battery, capacitor, supercapacitor and fuel cell, the method comprising the steps of:

(1) measuring voltage and current characteristics in a process of charging/discharging of charge storage device by applying a voltage/current at a predetermined discharge rate;

(2) measuring impedance spectra at a predetermined range of frequency by measuring the current and voltage from both terminals of the charge storage device or from an electrical load directly connected to the charge storage device at a plurality of states of charge within the entire charge/discharge interval; and (3) obtaining the parameters of the non-linear equivalent circuit of the charge storage device from the charge or discharge characteristics measured in step (1) and the characteristic impedance spectrum in the predetermined range of frequency measured in step (2).

2. The method as claimed in claim 1, wherein step (1) of measuring the voltage and current characteristics comprises measuring voltage at both terminals of the charge storage device when an input current having a predetermined discharge rate is applied to the charge storage device; and calculating an instantaneous change of the discharge voltage and storing data at each state of charge.

3. The method as claimed in claim 1, wherein in step (1), the input current having the predetermined discharge rate is sufficiently low enough to maintain steady-state for the instantaneous change (dE/dq) of the voltage (E) with respect to a discharge capacity (q) when it is applied to the charge storage device, the input current being expressed in mA less than a value obtained by dividing a nominal capacity expressed in mAh by one or more hrs.

4. The method as claimed in claim 1, wherein in step (2), the characteristic impedance spectrum is measured by a frequency scan method in which a series of sine waves having selected frequencies in a predetermined range of frequency are applied to the charge storage device as an input signal, and current and voltage signals measured at both terminals of the charge storage device are analyzed.

5. The method as claimed in claim 1, wherein in step (2), the characteristic impedance spectrum is measured by a Fourier transform method in which an input current or voltage composed by superposing multiple waves at selected non-overlapping frequencies in a predetermined range of frequency is applied to both terminals of the charge storage device and the current and voltage obtained are Fourier transformed to obtain the characteristic impedance spectrum.

6. The method as claimed in claim 1, wherein in step (2), the characteristic impedance spectrum is measured by a Laplace transform method in which voltage and current are measured by applying a current or voltage having a specified waveform in a predetermined range of frequency to said both terminals of the charge storage device or connecting an electrical load to the charge storage device which is Laplace transformed through a numerical analysis to obtain the impedance spectrum.

7. The method as claimed in claim 1, wherein in step (2), the characteristic impedance spectrum is measured by at least two methods selected from a frequency scan method in which a series of sine waves having selected frequencies in a predetermined range of frequency are applied to the charge storage device as an input signal, and current and voltage signals measured at both terminals of the charge storage device are analyzed; a Fourier transform method in which an input current or voltage composed by superposing multiple waves at selected non-overlapping frequencies is applied to said both terminals of the charge storage device and the current and voltage obtained are Fourier transformed; and a Laplace transform method in which voltage and current measured by applying a current or voltage having a specified waveform in a predetermined range of frequency to said both terminals of the charge storage device or by connecting an electrical load to the charge storage device is Laplace transformed by a numerical analysis.

8. The method as claimed in any one of claims 1 or 4 to 7, wherein the predetermined range of frequency is selected to have the ratio of the maximum frequency to the minimum frequency greater than 100.

9. The method as claimed in claim 1, wherein the non-linear equivalent circuit of the charge storage device in step (3) includes at least two elements selected from a resistor, capacitor, inductor, transmission line or a finite number of ladder-type two-terminals in place of the transmission lines.

10. The method as claimed in claim 1, wherein the non-linear equivalent circuit of the charge storage device in step (3) includes at least two elements selected from a resistor, capacitor, inductor, transmission line or a finite number of ladder-type two terminals in place of the transmission lines.

11. The method as claimed in claim 9 or 10, wherein the ladder-type two-terminals have a predetermined number of two-terminal circuits in the range of 20 $\mu$sec to 2,000 sec of time constant connected in parallel.

12. The method as claimed in claim 1, wherein the parameters in step (3) are components constituting the non-linear equivalent circuit of the charge storage device and include at least two elements selected from a serial resistance, macroscopic distributed resistance, charge transfer resistance, double layer capacitance, charge storage capacitance, pseudocapacitance, diffusion coefficient, open circuit voltage and instantaneous charge rate of voltage.

13. The method as claimed in claim 1, wherein the parameters in step (3) are determined from a complex impedance spectra by a non-linear least square fitting.

14. The method as claimed in claim 1, wherein the parameters in step (3) are determined from a slope of voltage characteristics vs. discharge capacity.

15. A method of determining characteristic parameters of a charge storage device, based on a wide frequency range of impedance measurements and a non-linear equivalent circuit model, which is used to obtain the parameters of the charge storage device such as a primary battery, secondary battery, capacitor, supercapacitor and fuel cell in a certain state of charge, the method comprising the steps of:
   (1) measuring a impedance spectrum in a predetermined range of frequency from voltage and current applied to both terminals of the charge storage device in the corresponding state of charge; and
   (2) determining parameters of the non-linear equivalent circuit of the charge storage device in the corresponding state of charge from the measured impedance spectrum in the predetermined range of frequency.

16. The method as claimed in claim 15, wherein in step (1), the impedance spectrum is measured by a frequency scan method in which a series of sine waves having selected frequencies in a predetermined range of frequency are applied to the charge storage device as an input signal and current; and voltage signals measured at said both terminals of the charge storage device are analyzed.

17. The method as claimed in claim 15, wherein in step (1), the impedance spectrum is measured by a Fourier transform method in which an input current or voltage composed of superposing multiple waves at selected non-overlapping frequencies in a predetermined range of frequency is applied to said both terminals of the charge storage device and the current and voltage obtained are Fourier transformed to measure the impedance spectrum.

18. The method as claimed in claim 15, wherein in step (1), the impedance spectrum is measured by a Laplace transform method in which voltage and current measured by applying a current or voltage having a specified waveform in a predetermined range of frequency to said both terminals of the charge storage device or by connecting an electrical load to the charge storage device is Laplace transformed by a numerical analysis to obtain the impedance spectrum.

19. The method as claimed in claim 15, wherein in step (1), the impedance spectrum is measured by at least two methods selected from a frequency scan method in which a series of sine waves having selected frequencies in a predetermined range of frequency are applied to the charge storage device as an input signal and the current and voltage signals measured at said both terminals of the charge storage device are analyzed; a Fourier transform method in which, an input current or voltage composed of superposing multiple waves at selected non-overlapping frequencies in a predetermined range of frequency is applied to said both terminals of the charge storage device and the current and voltage obtained are Fourier transformed; and a Laplace transform method in which the voltage and current measured by applying a current or voltage having a specified waveform in a predetermined range of frequency to said both terminals of the charge storage device or by connecting an electrical load to the charge storage device is Laplace transformed by a numerical analysis.

20. The method as in one of claims claims 15–19, wherein the predetermined range of frequency is selected to have a ratio in which the maximum frequency to the minimum frequency is greater than 100.

21. The method as claimed in claim 15, wherein the non-linear equivalent of the charge storage device in step (2) includes at least two elements selected from a resistor, capacitor, inductor, transmission line or a finite number of ladder-type two terminals in place of the transmissions lines.

22. The method as claimed in claim 15, wherein the non-linear equivalent circuit of the charge storage device in step (2) includes at least two elements selected from a constant current source, constant voltage source, non-linear resistor, non-linear capacitor, non-linear inductor, non-linear transmission line or a finite number of ladder-type non-linear two-terminals in place of the transmission lines.

23. The method as claimed in claim 21 or 22, wherein the ladder type two-terminals have a predetermined number of two-terminal circuits in the range of $°\mu sec$ to 2,000 sec of time constant connected in parallel.

24. The method as claimed in claim 15, wherein the parameters in step (2) are components constituting the non-linear equivalent circuit of the charge storage device and include at least two elements selected from a serial resistance, macroscopic distributed resistance, charge transfer resistance, double layer capacitance, charge storage capacitance, pseudocapacitance, diffusion coefficient, open circuit voltage and instantaneous change rate of voltage.

25. The method as claimed in claim 15, wherein the parameters in step (2) are determined from a complex impedance spectra by a non-linear least square fitting.

26. The method as claimed in claim 15 or 24, wherein the parameters in step (2) are determined from a slope of voltage characteristics vs. discharge capacity.

27. The method as claimed in claim 15, wherein the parameters of the non-linear equivalent circuit of the charge storage device are obtained, and an open circuit voltage of the charge storage device in a predetermined state of charge is also measured at the same time.

28. An apparatus for determining parameters of a charge storage device by a wide frequency range of impedance measurements and a non-linear equivalent circuit model comprising:
   a control means for determining parameters of the charge storage device and simulating various operational characteristics of a circuit including a charge storage device using the determined parameters;
   a digital-to-analog converter for converting a predetermined voltage and current data output from the control means to an analog signal;
   a potentiostat and/or galvanostat for applying the output signal of the digital-to-analog converter to the charge storage device to output the voltage and current of the capacitor;
   an analog-to-digital converter for converting a voltage based on the voltage and current of the charge storage device output from the potentiostat and/or galvanostat and feeding them into the control means; and
   a circuit simulator for simulating various operational characteristics of a charge storage device based on the parameters obtained from the control means for a predetermined equivalent circuit including the charge storage device.

29. The apparatus as claimed in claim 28, wherein the control means comprises:
  an I/O interface unit for interfacing the capacitor and a predetermined data;
  a central processing unit for controlling an operation for measuring voltage, current and impedance spectra of the charge storage device;
  means for measuring the voltage/current characteristic of the charge storage device under the control of the central processing unit;
  means for measuring the impedance spectra of the charge storage device under the control of the central processing unit; and
  means for determining the non-linear parameters by differentiating the measured values from the voltage/current measuring means and the impedance spectra as a function of charge capacity and performing a non-linear least square fitting from the differentiated values.

30. The apparatus as claimed in claim 29, wherein the impedance spectra measuring means measures the impedance spectra by detecting the voltage and current of the charge storage device while it outputs digital data of the voltage and current based on a plurality of predetermined frequencies sequentially; and performs a calculation on the detected voltage and current of the charge storage device.

31. The apparatus according to claim 30, wherein the detected voltage and current of the charge storage device are calculated by a amplitude/phase shift or Fourier transform method.

32. The apparatus as claimed in claim 29, wherein the impedance spectra measuring means measures the impedance spectra by measuring voltage and current while it applies superposed multiple wave signals selected at predetermined non-overlapping frequencies to the charge storage device, performing the Fourier transform of the measured voltage and current, and performing a calculation on a power spectrum.

33. The apparatus as claimed in claim 29, wherein the impedance spectra measuring means measures the impedance spectra by measuring voltage and current while it outputs voltage and current data having a specified waveform and applies them to the charge storage device, performing a linear regression of the measured voltage and current to calculate the impedance spectra, and performing a calculation on an error function of the impedance.

34. The apparatus as claimed in claim 28, further comprising a separate voltage/current generator for generating a voltage/current based on the digital data output from the control means and applying it to the charge storage device.

35. The apparatus as claimed in claim 28, wherein the galvanostat comprises:
  an inversion amplifier for inversion amplifying the output signal of the digital-to-analog converter and applying it to the (−) terminal of the charge storage device;
  a buffer for outputting voltages at said both terminals of the charge storage device; and
  a current-detecting resistance connected in series with the charge storage device for detecting the current of the charge storage device.

36. The apparatus as claimed in claim 28, further comprising first and second filter/amplifiers between the galvanostat and the analog-to-digital converter for filtering the voltage and current of the charge storage device detected by the galvanostat for removing noises and amplifying the voltage and current.

37. The method as claimed in claim 10, wherein the ladder type two-terminals have a predetermined number of two-terminal circuits in the range of 20 $\mu$sec to 2,000 sec of time constant connected in parallel.

38. The method as claimed in claim 22, wherein the ladder type two-terminals have a predetermined number of two-terminal circuits in the range of 20 $\mu$sec to 2,000 sec of time constant connected in parallel.

* * * * *

UNITED STATES PATENT AND TRADEMARK OFFICE
CERTIFICATE OF CORRECTION

PATENT NO. : 6,160,382
DATED : December 12, 2000
INVENTOR(S) : Yoon, et al.

It is certified that error appears in the above-identified patent and that said Letters Patent is hereby corrected as shown below:

Title page,
Item [73], delete "KUMBHO" and replace with KUMHO.

Signed and Sealed this

Sixth Day of November, 2001

*Attest:*

NICHOLAS P. GODICI
*Attesting Officer     Acting Director of the United States Patent and Trademark Office*